Figure 1:
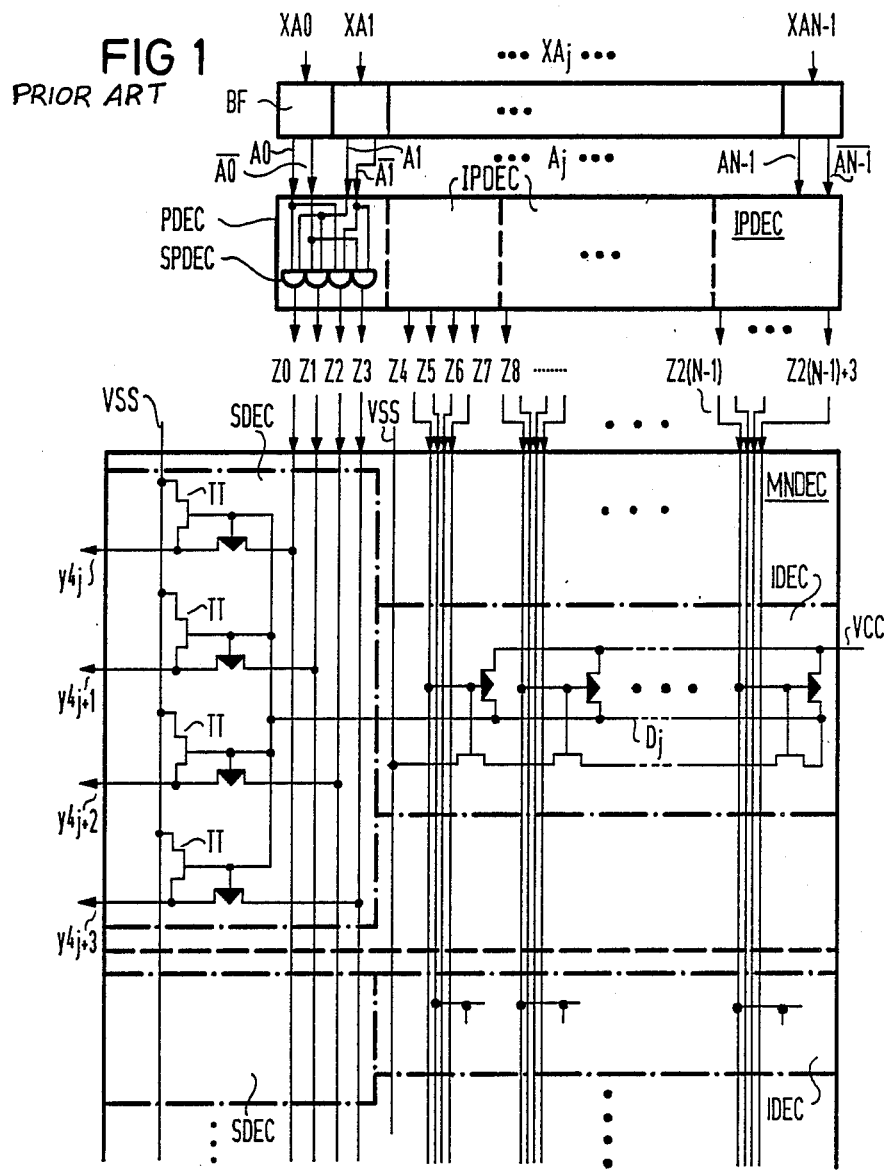

United States Patent [19]
Hoffmann et al.

[11] Patent Number: 4,855,621
[45] Date of Patent: Aug. 8, 1989

[54] MULTI-STAGE, INTEGRATED DECODER DEVICE HAVING REDUNDANCY TEST ENABLE

[75] Inventors: Kurt Hoffmann, Taufkirchen; Rainer Kraus, Munich; Oskar Kowarik, Grafing, all of Fed. Rep. of Germany

[73] Assignee: Siemens Aktiengesellschaft, Munich, Fed. Rep. of Germany

[21] Appl. No.: 168,672

[22] Filed: Mar. 16, 1988

[30] Foreign Application Priority Data

Mar. 16, 1987 [DE] Fed. Rep. of Germany ....... 3708522
Mar. 16, 1987 [DE] Fed. Rep. of Germany ....... 3708532

[51] Int. Cl.$^4$ .......................................... H03K 19/003
[52] U.S. Cl. ...................... 371/20; 307/441; 307/463; 307/243; 307/449; 365/230.06; 371/10
[58] Field of Search .............. 307/441, 443, 448–449, 307/451, 463, 469, 219, 243; 365/200–201, 230; 371/10–11, 21, 25

[56] References Cited

U.S. PATENT DOCUMENTS

| | | | |
|---|---|---|---|
| 4,194,130 | 3/1980 | Moench | 307/463 |
| 4,309,629 | 1/1982 | Kamuno | 307/449 |
| 4,584,674 | 4/1986 | Watanabe | 365/230 |
| 4,635,232 | 1/1987 | Iwahashi et al. | 371/10 X |
| 4,635,233 | 1/1987 | Matsumoto et al. | 365/230 |
| 4,672,240 | 6/1987 | Smith et al. | 307/441 X |
| 4,691,300 | 9/1987 | Pelley, III et al. | 371/10 X |
| 4,720,817 | 1/1988 | Childers | 371/11 X |
| 4,721,868 | 1/1988 | Cornell et al. | 307/243 X |
| 4,733,394 | 3/1988 | Giebel | 371/10 X |

OTHER PUBLICATIONS

"High Performance Complementary Decoder/Driver Circuit", *IBM T.D.B.*, vol. 29, No. 6, 11-1986, pp. 2390-2394.

*Primary Examiner*—David Hudspeth
*Attorney, Agent, or Firm*—Herbert L. Lerner; Laurence A. Greenberg

[57] ABSTRACT

A multi-stage, integrated decoder device includes a special function which facilitates the simultaneous activation of a plurality or as many as all of its outputs while gating out a pre-selectible output. When used as bit line decoder, it is thus possible to activate a plurality or up all of the bit lines (including any redundancy bit lines) of a block of storage cells of a semiconductor memory, excluding a bit line assumed to contain at least one defective storage cell.

6 Claims, 7 Drawing Sheets

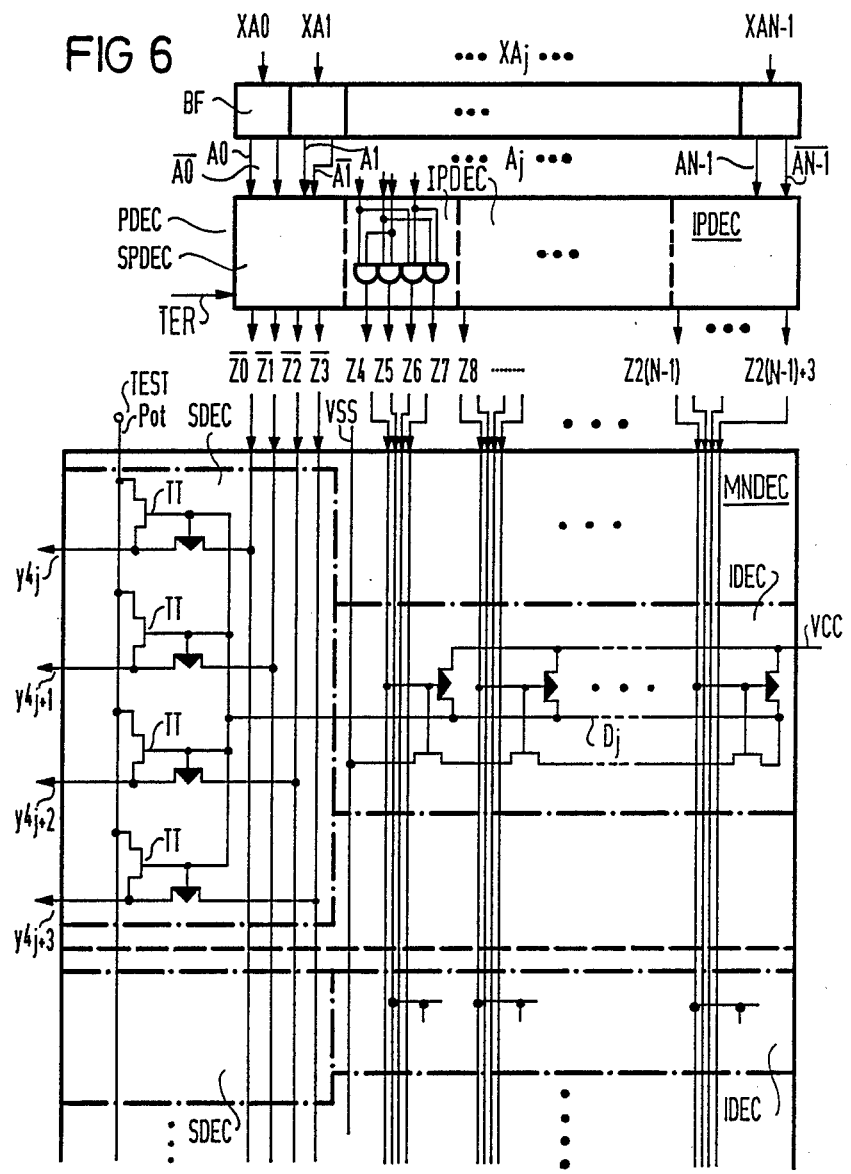

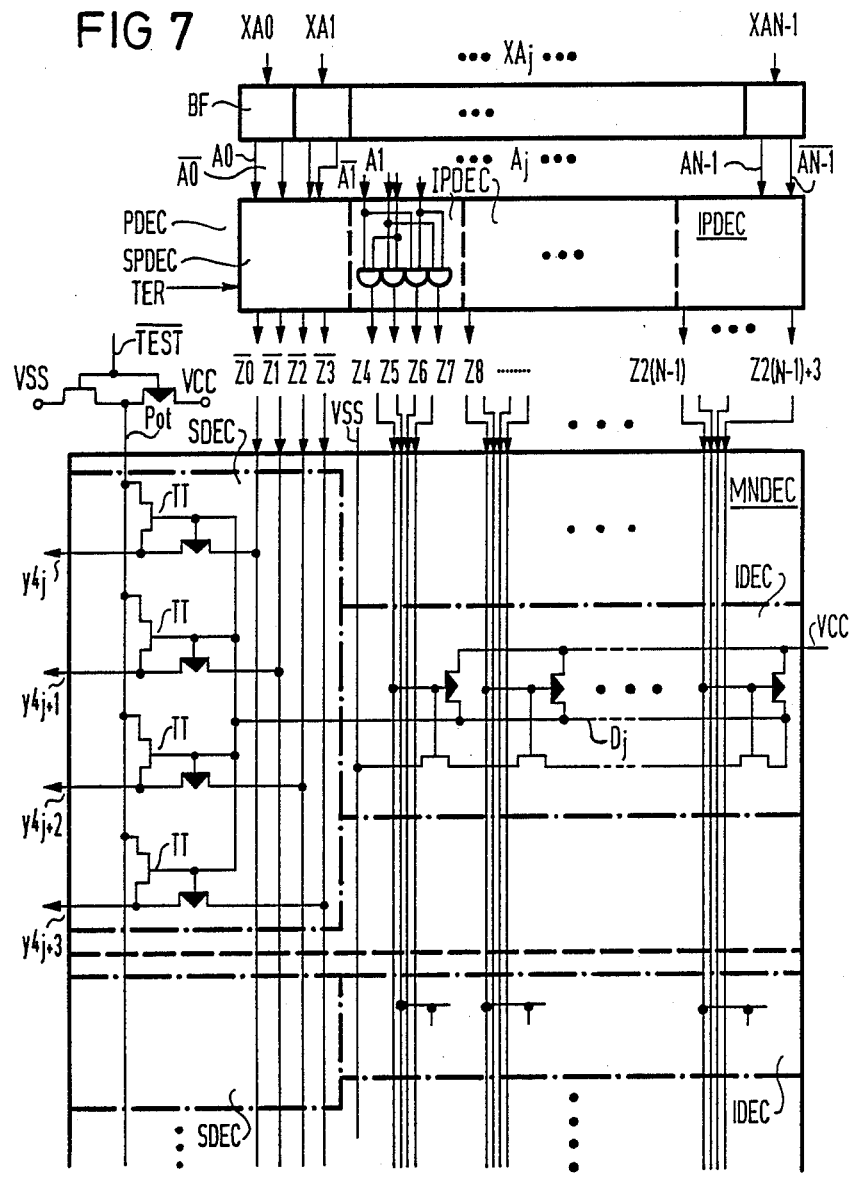

MULTI-STAGE, INTEGRATED DECODER DEVICE HAVING REDUNDANCY TEST ENABLE

The invention relates to a multi-stage, integrated decoder device, including at least a preliminary decoder device with a selection preliminary decoder and internal preliminary decoder units, the selection preliminary decoder and each internal preliminary decoder unit being in the form of one-from-n decoders, and a main decoder device having a plurality of selection decoders and internal decoders.

A device of the above-mentioned type is disclosed in the following publications:

(a) IEEE Journal of Solid-State Circuits, Vol. SC-18, No. 5, October 1983, Pages 457 to 462, "A 70 ns High Density 64K CMOS Dynamic RAM", and (b) 1986 IEEE International Solid-State Circuits Conference, Pages 260 to 261 and 365; "A 47 ns 64KW×4b CMOS DRAM with Relaxed Timing Requirements".

In both publications, devices of the type corresponding to the invention are disclosed in association with integrated semiconductor memories. As is the case with the present invention, the devices can be used both as word and as bit line decoders. The devices fundamentally include (at least by way of suggestion) three groups of sub-circuits: Preliminary Decoders, Main Decoders and Follow-up Decoders. The present invention is based on components which relate to the preliminary decoders and main decoders. As will be apparent to those skilled in the art, the invention can, of course, be combined with follow-up decoders in accordance with the above-mentioned publications.

It is accordingly an object of the invention to provide a multi-stage, integrated decoder device, which overcomes the hereinafore-mentioned disadvantages of the heretofore-known devices of this general type, which has the simplest possible structure and which permits more than one word line or bit line, such as in a block of storage cells of a semiconductor memory, to respond simultaneously, i.e. in parallel with one another, depending upon the application.

With the foregoing and other objects in view there is provided, in accordance with the invention, a multi-stage, integrated decoder device, comprising: a preliminary decoder device having a selection preliminary decoder and internal preliminary decoder units each being in the form of one-from-n decoders, the selection preliminary decoder including inverters supplying output signals, multiplexers receiving the output signals from the inverters and receiving non-inverted signals, and outputs connected downstream of the multiplexers supplying output signals of the selection preliminary decoder; means for supplying a test-enable-redundancy signal to the selection preliminary decoder selecting the output signals of the selection preliminary decoder between the output signals of the inverters and the non-inverted signals; a main decoder device and having a plurality of selection decoders and internal decoders, the selection decoders having outputs and transfer transistors with source terminals; and first and second potential lines each having one of two mutually-complementary levels independently of one another; a first half of the outputs of each of the selection decoders each being connected through the source terminals of a respective one of the transfer transistors to the first potential line, and a second half of the outputs of each of the selection decoders each having connected through the source terminals of a respective one of the transfer transistors to the second potential line.

In accordance with another feature of the invention, there are provided means for applying a test signal having logic levels which are adjustable to each of the potential lines.

In accordance with a further feature of the invention, the applying means are in the form of CMOS-inverters with outputs issuing the test signals as output signals, inputs receiving respective test auxiliary signals and sources connected between a supply potential and a reference potential.

With the objects of the invention in view, there is also provided a multi-stage, integrated decoder device, comprising: a preliminary decoder device having a selection preliminary decoder and internal preliminary decoder units each being in the form of one-from-n decoders, the selection preliminary decoder including inverters supplying output signals, multiplexers receiving the output signals from the inverters and receiving non-inverted signals, and outputs connected downstream of the multiplexers supplying output signals of the selection preliminary decoder; means for supplying a test-enable-redundancy signal to the selection preliminary decoder selecting the output signals of the selection preliminary decoder between the output signals of the inverters and the non-inverted signals; a main decoder device receiving output signals from the preliminary decoder device and having a plurality of selection decoders and internal decoders, the selection decoders having outputs and transfer transistors with source terminals; and a plurality of potential lines each having one of two mutually-complementary levels independently of one another; at least one group and as many as all of the outputs of each of the selection decoders each being connected through the source terminals of a respective one of the transfer transistors to one of the potential lines.

With the objects of the invention in view, there is furthermore provided a multi-stage, integrated decoder device, comprising: a preliminary decoder device having a selection preliminary decoder and internal preliminary decoder units each being in the form of one-from-n decoders, the selection preliminary decoder including inverters supplying output signals, multiplexers receiving the output signals from the inverters and receiving non-inverted signals, and outputs signals of the selection preliminary decoder; means for supplying a test-enable-redundancy signal to the selection preliminary decoder selecting the output signals of the selection preliminary decoder between the output signals of the inverters and the non-inverted signals; a main decoder device receiving output signals from the preliminary decoder device and having a plurality of selection decoders and internal decoders, the selection decoders having outputs and transfer transistors with source terminals; and a potential line having one of two mutually-complementary levels; each of the outputs of each of the selection decoders being connected through the source terminals of a respective one of the transfer transistors to the potential line.

In this context it should be expressly noted that the present invention can also be combined with the advantageous decoder device corresponding to co-pending U.S. application Ser. No. 168,652 having the same filling date as the instant application. These inventions can be applied particularly well in association with the methods and devices disclosed in co-pending U.S. applications Ser. Nos. 168,668; 168,676; 168,667 and 168,653 which also have the same filing date as the instant application.

Other features which are considered as characteristic for the invention are set forth in the appended claims.

Although the invention is illustrated and described herein as embodied in a multi-stage, integrated decoder device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 1 is a schematic and block circuit diagram of a decoder device in accordance with the prior art; and FIGS. 2 to 7 are schematic and block circuit diagrams of advantageous embodiments of the present invention.

Referring now to the figures of the drawings in detail and first, particularly, to FIG. 1 thereof, it is noted that the mode of functioning of a decoder device in accordance with the prior art as represented therein, will only be discussed briefly below since it will be familiar to those skilled in the art.

Address-input signals XAO to XAN-1, for example (where N is an even number), are intermediately stored in a buffer circuit BF and where appropriate (as assumed here), they are forwarded as true addresses AO to AN-1 and complementary addresses $\overline{AO}$ to $\overline{AN-1}$ to a preliminary decoder PDEC. The preliminary decoder PDEC is sub-divided into a selection preliminary decoder SPDEC and, for example, (N/2)-1 internal preliminary decoders IPDEC. With a suitable value for N, (N/3)-1 or a similar number of internal preliminary decoders IPDEC could also be provided. In the prior art as shown in FIG. 1, the selection preliminary decoder SPDEC and the internal preliminary decoders IPDEC are all identical. Each of these decoders is in the form of a so-called one-from-n-decoder (in the concrete example n is equal to two mutually-independent addresses Aj).

The output of the preliminary decoder PDEC is connected to a main decoder MNDEC including a plurality of selection decoders SDEC and internal decoders IDEC. One selection decoder SDEC and one internal decoder IDEC are assigned to one another both functionally and electrically, and vice versa. While the internal decoders IDEC are driven by output signals Z4 ... of the inner preliminary decoders IPDEC, the selection decoders SDEC are driven by output signals ZO to Z3 of the selection preliminary decoder SPDEC. If the device is used as a bit line decoder, each output signal Y4j ... of a selection decoder SDEC drives one bit line, such as a bit line of a block of storage cells of a semiconductor memory, through a pair of non-illustrated transfer transistors. The outputs of each selection decoder SDEC are connected to a reference potential VSS which is switched through the source terminals of transfer transistors TT.

Figure 3:
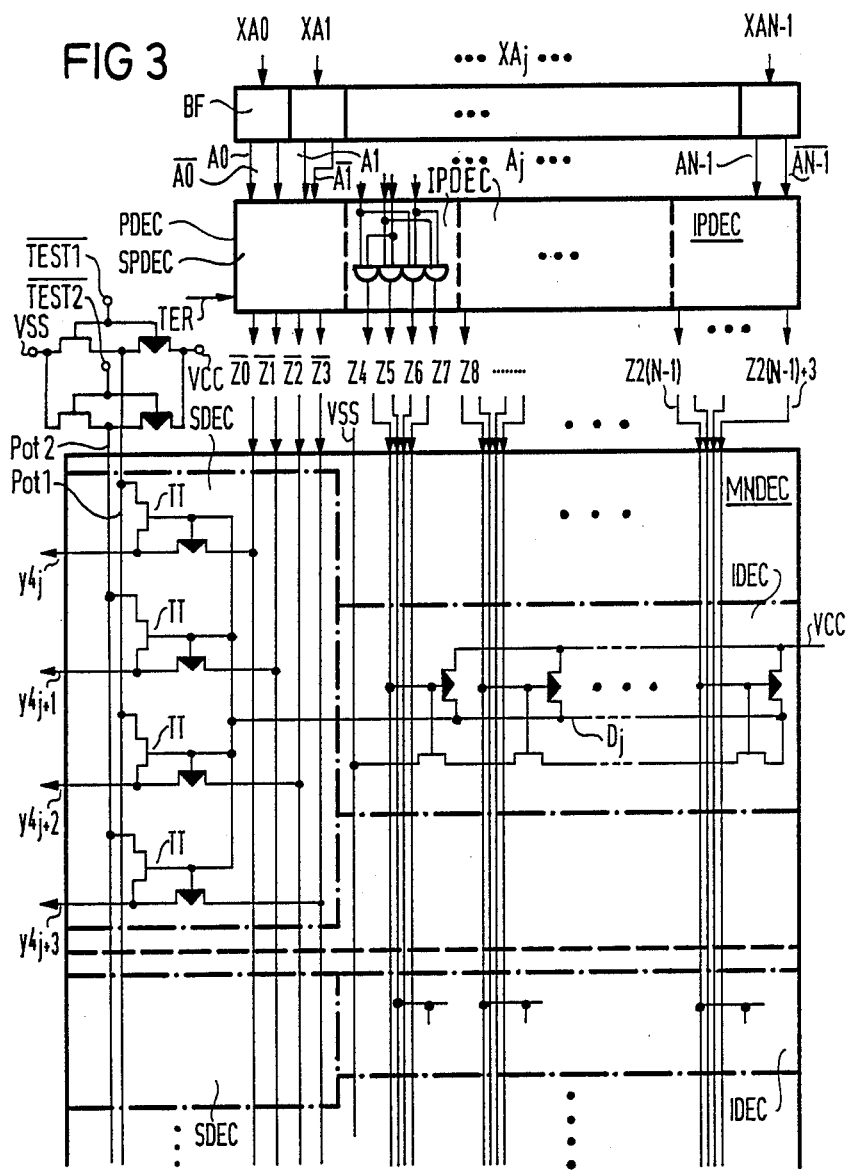
Figure 4:
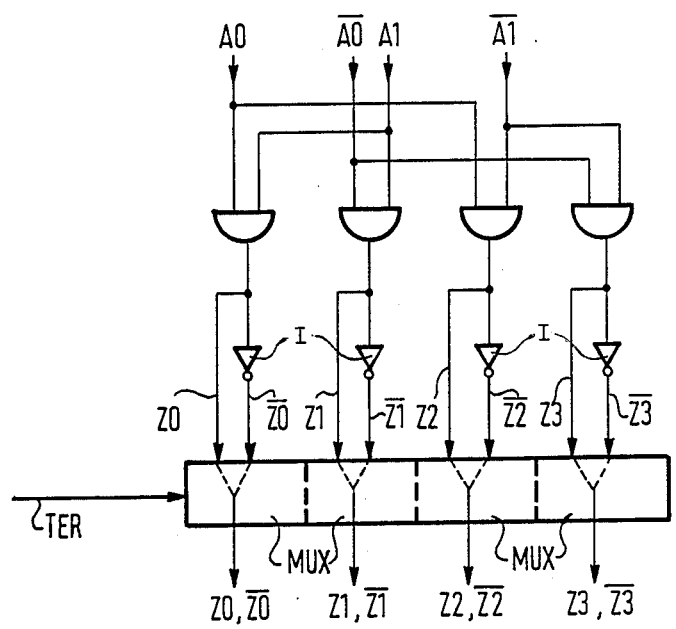

The decoder device in accordance with the invention as shown in FIGS. 2 to 7 differs from the prior art device shown in FIG. 1 with respect to the two following points;

(a) Each output of the selection preliminary decoder SPDEC is connected in series with or downstream of a multiplexer MUX and an inverter I, as seen in FIG. 4. The output signals ZO, $\overline{ZO}$; Z1, $\overline{Z1}$; Z2, $\overline{Z2}$; Z3, $\overline{Z3}$ of the selection preliminary decoder SPDEC are selected as either the output signals $\overline{ZO},\overline{Z1},\overline{Z2},\overline{Z3}$ of the inverter I or non-inverted signals ZO, Z1, Z2, Z3, in independence upon a test-enable redundancy signal TER. For reasons of clarity, the selection preliminary decoder SPDEC has only been shown in the form of a block circuit diagram in FIGS. 2, 3, 5 and 7; The selection preliminary decoder SPDEC is shown in more detail in FIG. 4.

(b) In the case of the prior art shown in FIG. 1, the outputs of each selection decoder SDEC are connected to a reference potential VSS which is switched through the source terminals of transfer transistors TT. However, in accordance with the invention, the sources of a first half of the transfer transistors TT are connected to a first potential line Pot1, and the sources of a second half of the transfer transistors TT are connected to a second potential line Pot2. Depending upon the actuation thereof, the two potential lines Pot1, Pot2 are assigned one of two mutually-complementary levls independently of one another. For example, in normal operation they are both assigned the reference potential VSS, which permits the normal operation of bit lines of a semiconductor memory. In test operation, in which, for example, only every second bit line is to be simultaneously activated (for parallel input or read-out for checkerboard test patterns, word lines could also be connected), a supply potential VCC of the semiconductor memory is connected to the first potential line Pot1 as a logic level, and the reference potential VSS is connected to the second potential line Pot2 as a logic level. The outputs of the selection decoders SDEC are also assigned corresponding levels in test operation.

Figure 2:
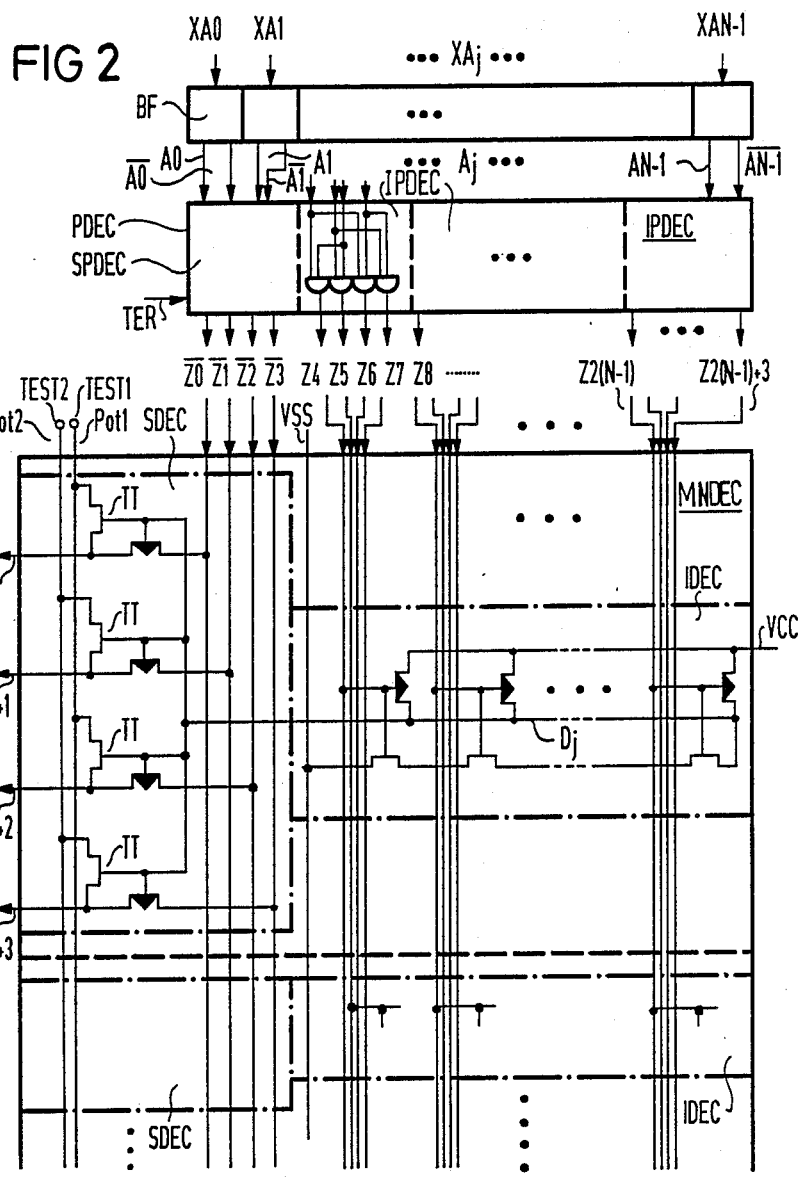

According to a first embodiment of the invention shown in FIG. 2, it is advantageous for the two potential lines Pot1, Pot 2 to be connected to test signals TEST1, TEST2 having logic levels which can be set independently of one another, for example to the values of the supply potential VCC and the reference potential VSS.

According to another embodiment shown in FIG. 3, it is also advantageous for the test signals TEST1, TEST2, to be output signals of CMOS-inverters which have inputs that are each connected to a respective first or second test auxiliary signal $\overline{TEST1}$, $\overline{TEST2}$, and which have sources connected between the supply potential VCC and the reference potential VSS.

Figure 5:
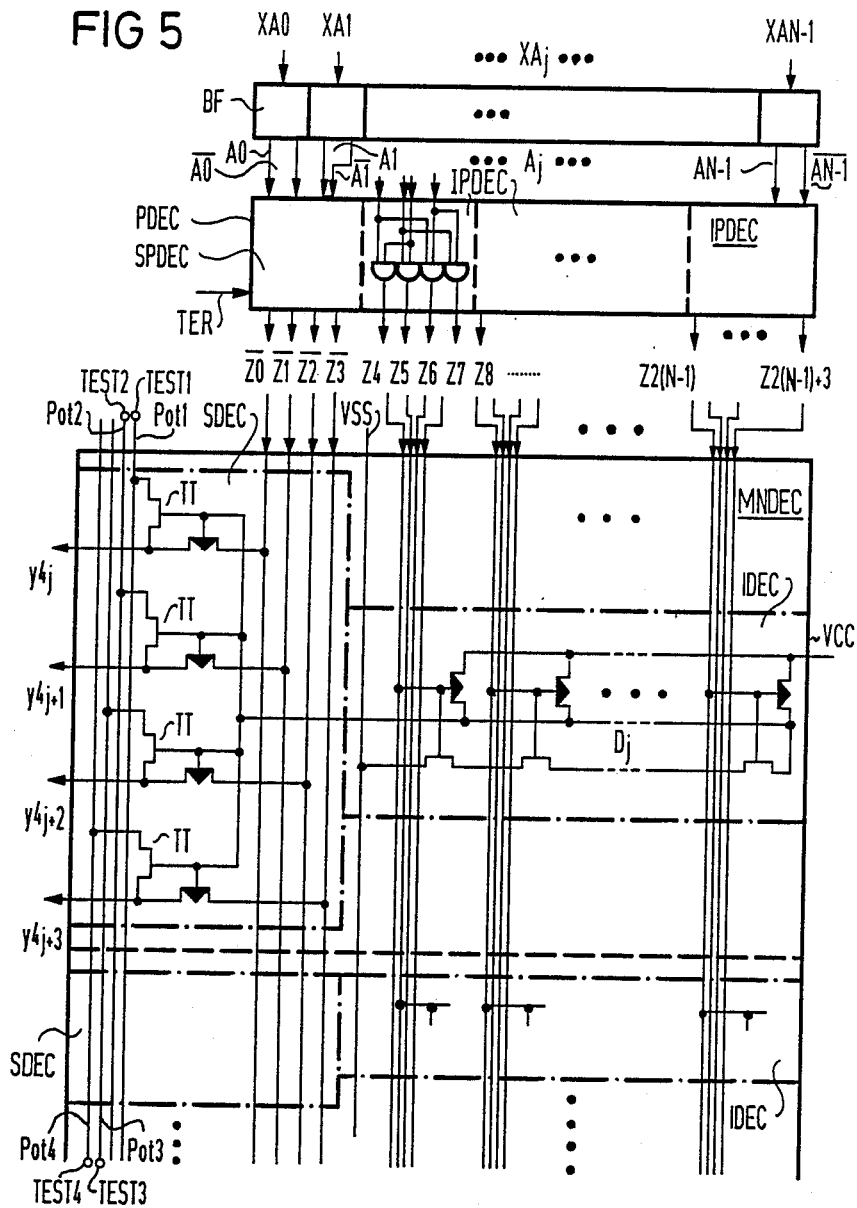

In an advantageous further development of the invention seen in FIG. 5, as expressed in general terms, at least one group of outputs Y4j ... and as many as all of the outputs Y4j ... of each selection decoder SDEC is connected to an individual potential line Pot1 ... Pot4, through the source terminal of the transfer transistor TT assigned to the respective output. All of the potential lines Pot1 to Pot4 are each assigned one of two mutually-complementary logic levels, independently of one another, in accordance with the actuation thereof.

This has the advantage of permitting more complicated checkerboard-like test patterns (e.g. '11001100') to be tested as well as quite simple test patterns such as "All 1's", in addition to the checkboard test pattern ('1010').

FIGS. 6 and 7 are diagrams of simplified advantageous embodiments. In place of the minimum of two potential lines Pot1, Pot2 mentioned above, the embodiment of FIG. 6 includes only one single potential line Pot. The one potential line Pot is connected to each output Y4j, Y4j+1, . . . of each selection decoder SDEC through the source terminal of a transfer transistor TT.

The embodiment shown in FIG. 7 combines the embodiments of FIGS. 3 and 6. The mode of functioning of the embodiment of FIG. 7 will be self-explanatory to those skilled in the art in combination with the foregoing details.

Although the embodiments shown in FIGS. 6 and 7 limit the above-mentioned number of test patterns which can be used, they offer the advantage of a simpler and more space-saving construction through the omission of at least one potential line which normally occupies a large amount of space.

An important advantage of the present invention, when used as a bit line decoder, resides in the additional ability to test redundancy storage cells without the need to activate the normal redundancy mechanism (e.g. through laser links), which is normally irreversible, as well as in the ability to simultaneously gate-out a bit line (assumed to contain at least one defective storage cell) from the normal storage cell array. By simply connecting the address of the defective storage cell to the overall decoder device, simultaneously connecting the test-enable-redundancy signal TER, and setting at least one of the potential lines Pot1, Pot2, Pot3, Pot4 to the supply potential VCC, a plurality or as many as all of the decoder outputs Y4j . . . (including those for redundancy bit lines) of the overall decoder are activated, with the exception of the decoder output which is connected to the bit line assigned to the defective storage cell.

We claim:

1. Multi-stge, integrated decoder device, comprising:
   a preliminary decoder device having a selection preliminary decoder and internal preliminary decoder units each being in the form of one-from-n decoders, said selection preliminary decoder including inverters supplying output signals, multiplexers receiving said output signals from said inverters and receiving non-inverted signals, and outputs connected downstream of said multiplexers supplying output signals of said selection preliminary decoder;
   means for supplying a test-enable-redundancy signal to said selection preliminary decoder selecting said output signals of said selection preliminary decoder (SPDEC) between said output signals of said inverters and said non-inverted signals;
   a main decoder device receiving output signals from said preliminary decoder device and having a plurality of selection decoders and internal decoders, said selection decoders having outputs and transfer transistors with source terminals; and
   first and second potential lines each having one of two mutually-complementary levels independently of one another;
   a first half of said outputs of each of said selection decoders each being connected through the source terminals of a respective one of said transfer transistors to said first potential line, and a second half of said outputs of each of said selection decoders each being connected through the source terminals of a respective one of said transfer transistors to said second potential line.

2. Multi-stage, integrated decoder device according to claim 1, including means for applying a test signal having logic levels which are adjustable to each of said potential lines.

3. Multi-stage, integrated decoder device according to claim 2, wherein said applying means are in the form of CMOS-inverters with outputs issuing the test signals as output signals, inputs receiving respective test auxiliary signals and sources connected between a supply potential and a reference potential.

4. Multi-stage, integrated decoder device, comprising:
   a preliminary decoder device having a selection preliminary decoder and internal preliminary decoder units each being in the form of one-from-n decoders, said selection preliminary decoder including inverters supplying output signals, multiplexers receiving said output signals from said inverts and receiving non-inverted signals, and outputs connected downstream of said multiplexers supplying output signals of said selection preliminary decoder;
   means for supplying a test-enable-redundancy signal to said selection preliminary decoder selecting said output signals of said selection preliminary decoder between said output signals of said inverters and said non-inverted signals;
   a main decoder device receiving output signals from said preliminary decoder device and having a plurality of selection decoders and internal decoders, said selection decoders having outputs and transfer transistors with source terminals; and
   a plurality of potential lines each having one of two mutually-complementary levels independently of one another;
   at least one group of said outputs of each of said selection decoders each being connected through the source terminals of a respective one of said transfer transistors to one of said potential lines.

5. Multi-stage, integrated decoder device according to claim 4, wherein said at least one group of said outputs of each of said selection decoders includes all of said outputs of each of said selection decoders.

6. Multi-stage, integrated decoder device, comprising:
   a preliminary decoder device having a selection preliminary decoder and internal preliminary decoder units each being in the form of one-from-n decoders, said selection preliminary decoder including inverters supplying output signals, multiplexers receiving said output signals from said inverters and receiving non-inverted signals, and outputs connected downstream of said multiplexers supplying output signals of said selection preliminary decoder;
   means for supplying a test-enable-redundancy signal to said selection preliminary decoder selecting said output signals of said selection preliminary decoder between said output signals of said inverters and said non-inverted signals;
   a main decoder device receiving output signals from said preliminary decoder device and having a plurality of selection decoders and internal decoders, said selection decoders having outputs and transfer transistors with source terminals; and
   a potential line having one of two mutually-complementary levels; each of said outputs of each of said selection decoders being connected through the source terminals of a respective one of said transfer transistors to said potential line.

* * * * *